United States Patent
Goarin (10) Patent No.: US 8,227,857 B2
(45) Date of Patent: Jul. 24, 2012

(54) PLANAR EXTENDED DRAIN TRANSISTOR AND METHOD OF PRODUCING THE SAME

(75) Inventor: Pierre Goarin, Graz (BE)

(73) Assignee: NXP B.V., Eindhoven (NL)

( * ) Notice: Subject to any disclaimer, the term of this patent is extended or adjusted under 35 U.S.C. 154(b) by 456 days.

(21) Appl. No.: 12/531,578

(22) PCT Filed: Mar. 12, 2008

(86) PCT No.: PCT/IB2008/050893
§ 371 (c)(1),
(2), (4) Date: Sep. 16, 2009

(87) PCT Pub. No.: WO2008/114167
PCT Pub. Date: Sep. 25, 2008

(65) Prior Publication Data
US 2010/0096694 A1 Apr. 22, 2010

(30) Foreign Application Priority Data
Mar. 19, 2007 (EP) .................................... 07104400

(51) Int. Cl.
*H01L 29/78* (2006.01)
*H01L 21/336* (2006.01)

(52) U.S. Cl. ........ 257/331; 257/401; 257/337; 438/270; 438/283

(58) Field of Classification Search .................. 257/331, 257/401, 337, E29.134, E29.256, E21.417; 438/270, 283
See application file for complete search history.

(56) References Cited

U.S. PATENT DOCUMENTS

| 6,118,149 | A * | 9/2000 | Nakagawa et al. | 257/330 |
| 6,215,149 | B1 * | 4/2001 | Lee et al. | 257/328 |
| 6,452,231 | B1 * | 9/2002 | Nakagawa et al. | 257/343 |
| 6,617,656 | B2 * | 9/2003 | Lee et al. | 257/401 |
| 6,770,529 | B2 * | 8/2004 | Lee et al. | 438/247 |
| 7,091,557 | B2 * | 8/2006 | Deboy | 257/339 |
| 7,372,086 | B2 * | 5/2008 | Sato et al. | 257/250 |
| 7,423,325 | B2 * | 9/2008 | Tihanyi | 257/401 |
| 2004/0002196 | A1 * | 1/2004 | Lee et al. | 438/301 |
| 2004/0089896 | A1 * | 5/2004 | Sakakibara | 257/330 |

(Continued)

FOREIGN PATENT DOCUMENTS

JP      2003163225      11/2001

(Continued)

OTHER PUBLICATIONS

Nakagawa, A., et al; "Improved 20V Lateral Trench Gate Power MOSFETS With Very Low On-Resistance of 7.8 MOHM.MM2"; Proceedings of the 12th Int'l Symposium on Power Semiconductor Devices and ICS; Toulouse, FR; May 22-25, 2000; pp. 47-50; XP000987831; IEEE, New York, NY, US; ISBN: 978-0-7803-6269-7.

*Primary Examiner* — Ha Tran T Nguyen
*Assistant Examiner* — Jordan Klein (57) ABSTRACT

A planar extended drain transistor (100) is provided which comprises a control gate (102), a drain region (109), a channel region (107), and a drift region (108), wherein the drift region (108) is arranged between the channel region (107) and the drain region (109). Furthermore, the control gate (102) is at least partially buried into the channel region (107) and the drift region (108) comprises a doping material density which is lower than the doping material density of the drain region (109).

17 Claims, 8 Drawing Sheets

U.S. PATENT DOCUMENTS

| | | | |
|---|---|---|---|
| 2004/0099922 A1* | 5/2004 | Yamaguchi | 257/500 |
| 2004/0256693 A1* | 12/2004 | Sato et al. | 257/510 |
| 2006/0006386 A1* | 1/2006 | Hirler et al. | 257/60 |
| 2006/0131666 A1* | 6/2006 | Li et al. | 257/387 |
| 2006/0261384 A1* | 11/2006 | Rueb et al. | 257/288 |
| 2007/0114601 A1* | 5/2007 | Lin et al. | 257/330 |
| 2008/0261358 A1* | 10/2008 | Sonsky | 438/197 |

FOREIGN PATENT DOCUMENTS

| | | |
|---|---|---|
| WO | 2006/082568 A | 8/2006 |

* cited by examiner

PLANAR EXTENDED DRAIN TRANSISTOR AND METHOD OF PRODUCING THE SAME

FIELD OF THE INVENTION

The invention relates to a planar extended drain transistor. Beyond this, the invention relates to a method of producing a planar extended drain transistor.

BACKGROUND OF THE INVENTION

Extended drain MOS (EDMOS) transistors are one of the main devices used in the embedded power market. Their structure is similar to conventional MOSFETs. EDMOS transistors comprise a region between the drain region and the channel region that is called the drift region and that is lowly or lightly doped. This drift region is used to get higher breakdown voltage than the one of the p-n junction between channel and drain.

Figure 7A:
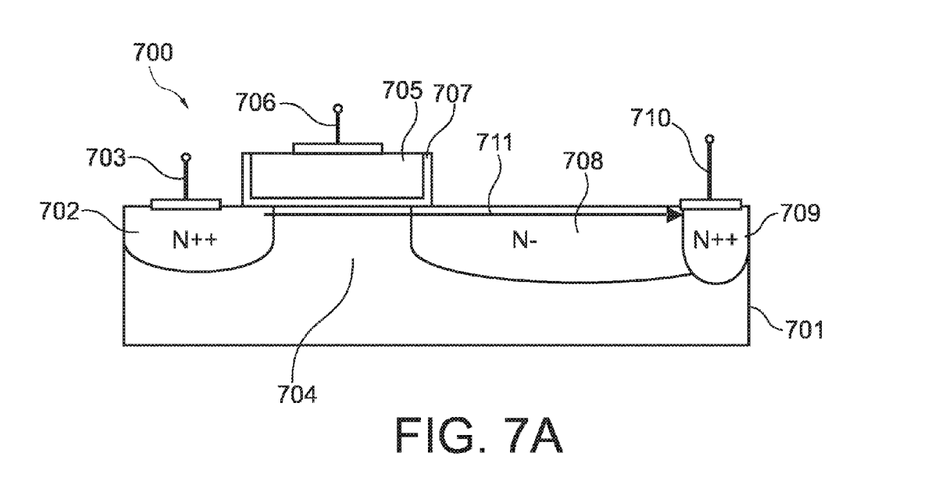
FIG. 7 schematically illustrates a conventional planar extended drain transistor.
Figure 7B:
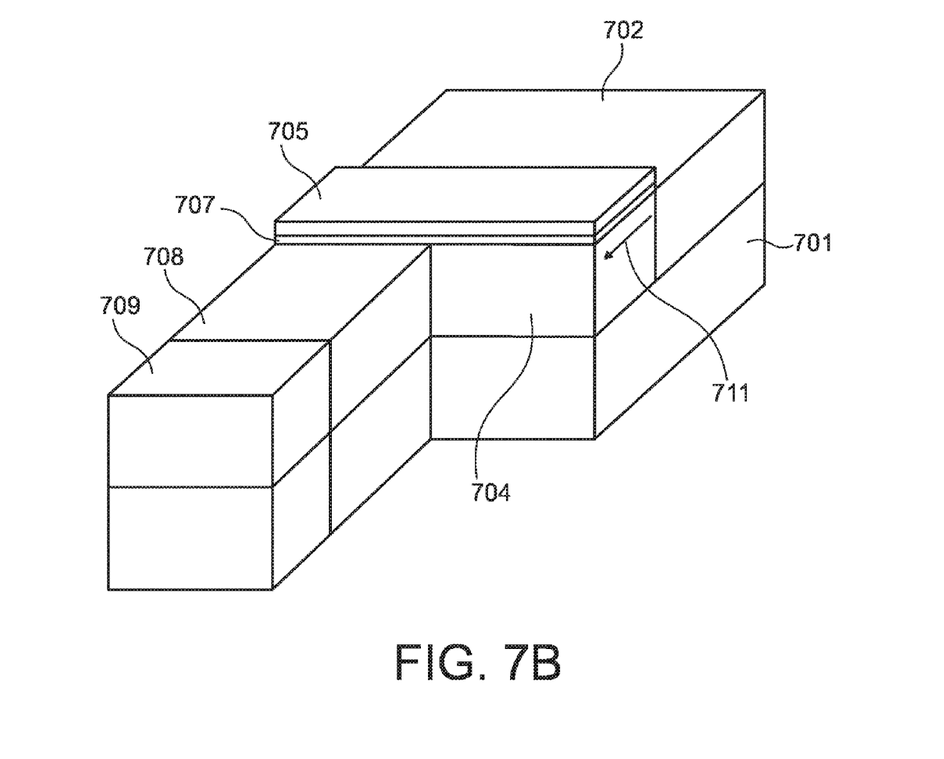

Such a conventional EDMOS, which is similar to the one shown for example in US 2004/002196, transistor is schematically shown in FIG. 7. In FIG. 7A there is shown a NMOS transistor in a cross-sectional view along a longitudinal axis from source to drain. The EDMOS transistor 700 of FIG. 7A comprises a substrate 701 having different regions formed thereon. From the left to the right in FIG. 7A a source region 702 formed by a highly doped region (N++) and connected to a source region contact 703 is shown. Next a channel region 704 is formed by a p-well on top of which a control gate 705 is formed which has a control gate contact 706 and which is insulated from the channel region 704 by a gate insulating layer 707. Next a drift region 708 is formed in the substrate, which drift region is only lightly doped (N−). A highly doped region (N++) forms a drain region 709, wherein the drain region 709 is connected to a drain contact 710. An arrow 711 schematically illustrates the current flow. FIG. 7B shows a perspective view of the EDMOS transistor of FIG. 7A. For illustrative reasons a portion of the drain region 709 and the drift region 708 are cut away. Furthermore, the different regions are shown as simple cuboids.

Depending on the type of breakdown voltage wanted the drift region will be extended or not and/or its doping will be lowered or increased. So for low breakdown voltages the length of this region is relatively small and its doping relatively high. However, this leads to the fact that the contribution to the overall resistance of the transistor or device is relatively limited and the overall resistance is caused mainly by the channel resistance.

OBJECT AND SUMMARY OF THE INVENTION

It is an object of the invention to provide a planar extended drain transistor and a method of producing the same, wherein the planar extended drain transistor may exhibit a lower resistance and thus may enable a greater current flow through the transistor while, preferably, at the same time does not occupy a greater area.

In order to achieve the object defined above, a planar extended drain transistor and a method of producing the same according to the independent claims are provided.

According to an exemplary embodiment a planar extended drain transistor is provided which comprises a control gate, a drain region, a channel region, and a drift region, wherein the drift region is arranged between the channel region and the drain region. Furthermore, the control gate is at least partially buried into the channel region and the drift region comprises a doping material density, which is lower than the doping material density of the drain region. In particular, the planar extended drain transistor may comprise precisely one drift region. That is, only one drift region is arranged between the drain region and the channel region, while no drift region is arranged between the source region and the channel region, i.e. the channel region and the source region are joined to each other. Furthermore, the control gate and the channel region may be insulated from each other by a gate insulation layer.

According to an exemplary embodiment a method of manufacturing a planar extended drain transistor is provided, wherein the method comprises forming a semiconductor layer on a substrate, wherein the semiconductor layer has a first side which is in contact with the substrate and a second opposite side which forms a surface, and forming a trench into a first portion of the semiconductor layer by removing parts of the semiconductor layer in the first portion in such a way that at least a portion of the trench below the surface of the semiconductor layer is removed. Furthermore, a control gate is formed in the trench and a planar extended drain transistor is formed by forming a drain region, a source region, a drift region, and a channel region in the semiconductor layer, wherein the channel region is formed in the first portion in such a way that at least a portion of the control gate is buried by the channel region. In particular, a gate insulation layer may be formed in the trench before the control gate is formed. Furthermore, the channel region may optionally be formed by remaining parts of the first portion of the semiconductor layer, i.e. from parts that were not removed in the forming of the trench. In particular, the trench may have a trapezoid cross-section. According to this exemplary embodiment, the substrate may be formed by any suitable substrate, e.g. by an SOI-substrate.

The term "planar" may in particular denote that the transistor is, relative to the extent of a substrate, horizontally arranged and may in particular be distinguished from a so-called vertical transistor.

The term "buried" may in particular denote that at least a portion of a first layer, e.g. the control gate, is arranged below the surface of a second layer, e.g. the channel region. For example, the first layer may be completely enclosed by the second layer or the first layer may be formed in a trench that is formed in the second layer. Thus, leading to an arrangement in which at least a part of the control gate is positioned below a level formed by a surface level of the channel region. Optionally, there may be of course a third layer between the first layer and the second layer, e.g. a gate insulation layer.

The term "drift region" may in particular denote a region between the drain region and the channel region that that is lowly or lightly doped. In particular, this drift region may be doped by the same doping material as the drain region but will be doped less dense, i.e. less ions may be implemented in the drift region than in the drain region. This drift region may be used to get higher breakdown voltage than the one of the p-n junction between channel and drain.

By a planar extended drain transistor (planar EDMOS transistor) according to the above described exemplary embodiment it may possible to provide more than one channel region, since at least parts of the control gate are arranged buried into the channel region. In particular, there may be formed two channel regions or current paths, wherein one is formed below the control gate and the other one is above the gate. This may lead to the fact that the resistance of the channel region may be reduced, since a greater area of the channel region may be influenced by the control gate, so that it may be possible that a higher current flows through the channel region without increasing the total area of the planar EDMOS transistor. In particular, it may not be necessary to increase the width of the channel region to increase the possible current, as it would be in a common EDMOS, since in an EDMOS transistor according to the exemplary embodiment there is more than one possible current path. By burying at least a part of the control gate into the channel region which is arranged between the source region and the drift region it may be possible to achieve a straight current flow from the source region through the channel region and the drift region to the drain region, while possibly providing several current paths.

It may be seen as a gist of an exemplary embodiment to bury or to recess at least one control gate into the semiconductor layer the channel region is formed from to possibly increase the number of channels and/or the area of the channel for the same device area. That way it may be possible to multiply the number of current paths in order to have more channel resistance paths in parallel which may drastically reduce or decrease the channel resistance. In an illustrative way it may be said that the control gate density may be increased. For producing the buried control gate a trench may be dig into the channel region, wherein the trench may have a trapezoid or tubular shape in cross-section, for example. In particular, the process flow in the method according to an exemplary embodiment may stick as much as possible to the standard process flow, so that possibly only few additional process steps may be added compared to a conventional CMOS process flow. In particular, the number of additional masks may be limited in a process flow according to an exemplary embodiment of the method. According to an exemplary embodiment the planar extended drain transistor may be formed as a NMOS or an PMOS device.

Next, further exemplary embodiments of the planar extended drain transistor are described. However, these embodiments also apply to the method of producing the same.

According to another exemplary embodiment the planar extended drain transistor further comprises a control gate contact and a source region, wherein the control gate contact is electrically connected to the control gate, and wherein the source region is at least partially arranged between the channel region and the control gate contact. That is, the control gate contact may be arranged farther away from the channel region than the source region. In particular a portion of the control gate may be arranged buried under the source region and/or the channel region. In particular, a gate insulation layer may be further arranged between the source region and the control gate contact and/or the control gate.

The arrangement of portions of the control gate buried into the channel layer or arranged below the surface of the channel layer may lead to the fact that more than one channel region is formed, which may lead to the fact that a greater current may flow between the source region and the drain region. The term "channel layer" may in particular denote the whole layer which forms the channel, e.g. a layer which is formed as a single layer of the same material, if necessary a doped material. The term "channel region" may in particular denote the portions of the channel layer which are causing the current flow between a source region and a drain region, i.e. the portions of the channel layer which provide the functionality of the channel of a transistor.

According to another exemplary embodiment of the planar extended drain transistor the control gate is formed by a layer. In particular, at least portions of the control gate may have a plate shaped form. Furthermore a plurality of control gates may be formed by a plurality of plate shaped layers, which may be arranged in a sandwiched manner, i.e. in an alternating way in which a plate shaped control gate is followed by a channel region which is again followed by a plate shaped control gate and so on. In particular, at least one plate shaped control gate may be buried completely in the channel layer. That is, a multilayered sandwich structure may be formed in a first portion of the transistor, namely in the channel region, which is arranged between the source region and the drift region. This sandwich structure may form a plurality of control gates and a plurality of channel regions providing a plurality of current flow paths.

According to another exemplary embodiment the planar extended drain transistor further comprises a plurality of control gates, wherein the control gates have a substantially circular cross section. In particular, the control gates may have a longitudinal axis extending between the source region and the drift region, wherein the cross section is taken perpendicular to the longitudinal axis. Thus, control gates may be formed having a substantially tubular shape. In particular, the tubular shaped control gates may be buried into the channel layer, e.g. may be completely embedded by the channel layer. The tubular shaped control gates may form a kind of layer, i.e. may be arranged horizontally in one plane in the coordinate system of the planar transistor. Optionally, a plurality of such control gate layers, each having a plurality of tubular shaped control gates, may be formed in the channel layer.

According to another exemplary embodiment the planar extended drain transistor further comprises a plurality of control gates, wherein the plurality of control gates have a comb-like structure. In particular, the comb-like structure may comprise or may be formed by a plurality of trenches, which may be formed in the channel layer or channel region.

The term "comb-like structure" may in particular denote a structure that—in a cross-sectional view—comprises a plurality of control gates and a plurality of channel regions which are arranged in a teeth-like structure, i.e. the control gates and the channel regions mesh into another. The comb-like structure may increase the area of the channel regions, i.e. the area in which current may flow, since a larger area of the channel layer will be influenced by a state of the control gate.

According to another exemplary embodiment the planar extended drain transistor further comprises at least one control gate contact, and a source region, wherein the at least one control gate contact is electrically connected to at least one of the plurality of control gates, and wherein the at least one control gate contact is at least partially arranged between the drift region and the source region.

Such an arrangement may lead to the following sequence of regions. The first region is formed by the drain region, adjoining the drift region, adjoining the channel region in which the control gates are incorporated or embedded which channel region is adjoined by the source region.

Next, further exemplary embodiments of the method of producing the planar extended drain transistor are described. However, these embodiments also apply to the planar extended drain transistor.

According to another exemplary embodiment the method further comprises forming an intermediate layer onto a second portion of the substrate, and forming the semiconductor layer onto the substrate and the intermediate layer in such a way that the first portion of the semiconductor layer is arranged on the intermediate layer. In particular, the semiconductor layer may cover the intermediate layer completely or partially. For example, the intermediate layer may comprise or may be formed by SiGe while the semiconductor layer may be formed by silicon.

This exemplary embodiment may not be limited to a manufacturing method of an EDMOS transistor but may also be used to manufacture an LDMOS or CMOS transistor. In other words, the term "extended drain" in "planar extended drain transistor" is purely optional. That is, in particular no forming of a drift region is necessary on contrary for this exemplary embodiment the forming of the drift region is purely optional.

According to another exemplary embodiment the method further comprises that the forming of the trench is done in such a way that the trench contacts the intermediate layer. For example, the trench is formed so that the trench exposes parts of the intermediate layer, e.g. a top face of the intermediate layer or a side face of the intermediate layer. Thus, at least portions of the intermediate layer may be accessible from the outside, e.g. the surface of the semiconductor layer.

According to another exemplary embodiment the method further comprises forming a cavity by removing the intermediate layer before the control gate is formed. In particular, etching may do the removing. In case SiGe forms the intermediate layer and silicon forms the semiconductor layer, the intermediate layer may be easily removed by etching, since SiGe may be etched with a higher etching rate as silicon. Furthermore, the control gate may be formed in the trench and in the cavity.

Forming the control gate as well in the cavity may lead to the fact that at least portions of a control gate are completely enclosed or surrounded by the channel region, i.e. completely buried under the channel region. This may lead to the fact that the channel region may be formed by a great area surrounding the control gate so that a greater current may flow through the channel region under the control of the switching of the control gate.

According to another exemplary embodiment the method further comprises forming a control gate contact which connects the control gate formed in the trench, wherein the source region is formed at least partially between the channel region and the control gate contact. That is, the control gate contact may be formed farther away from the channel region as the source region. In particular, the source region may surround a part of the control gate that is contacted by the control gate contact.

This may result in a horizontal arrangement of the different regions of the planar extended drain transistor like drain region, drift region, channel region, source region, and control gate contact, wherein the control gate itself may be formed partially below or buried into the channel region and parts of the source region. That is, the source region may cover parts of the control gate.

According to another exemplary embodiment the method further comprises forming a plurality of trenches in the first portion of the semiconductor layer, and forming a plurality of control gates in the plurality of trenches. In particular, the trenches may be formed substantially parallel to each other, e.g. in a comb-like structure. For example, each of the trenches may have a trapezoid cross-section leading to the fact that a cross-section through the first portion of the semiconductor layer may looks like a teeth-like structure. Preferably, in each trench one control gate may be formed.

According to another exemplary embodiment the method further comprises forming one control gate contact contacting at least a number of the plurality of control gates in the first portion of the semiconductor. In particular, each control gate is connected to the control gate contact that may be arranged directly above the control gates formed in the trenches. That is, the control gate contact may be formed above the channel region of the transistor.

According to another exemplary embodiment the method further comprises forming a plurality of tube-like cavities from the plurality of trenches, and forming a plurality of control gates in the plurality of tube-like cavities. In particular, this may be done by hydrogen annealing the semiconductor layer, e.g. formed by silicon, i.e. an annealing step which is performed under a hydrogen atmosphere at increased temperature.

This exemplary embodiment may not be limited to a manufacturing method of an EDMOS transistor but may also be used to manufacture an LDMOS or CMOS transistor. In other words, the term "extended drain" in "planar extended drain transistor" is purely optional. That is, in particular no forming of a drift region is necessary on contrary for this exemplary embodiment the forming of the drift region is purely optional.

According to another exemplary embodiment the method further comprises forming a further trench into the semiconductor layer in such a way that at least a portion of each of the cavities is exposed to the further trench.

This further trench may subsequently be used to form a contact to the cavities, i.e. to the control gates formed in the cavities.

Summarizing, one exemplary aspect of the invention may be seen in the burying of at least one control gate into the semiconductor layer from which the channel region is formed to possibly increase the number of channels and/or the area of the channel for the same device area. In this manner it may be possible to multiply the number of current paths in order to have more channel resistance paths in parallel that may drastically reduce or decrease the channel resistance.

The aspects defined above and further aspects of the invention are apparent from the examples of embodiment to be described hereinafter and are explained with reference to these examples of embodiment. The aspects and exemplary embodiments described above may be combined, i.e. features explicitly described in connection with one exemplary embodiment may be combined with another described exemplary embodiment.

BRIEF DESCRIPTION OF THE DRAWINGS

The invention will be described in more detail hereinafter with reference to examples of embodiment but to which the invention is not limited.

DESCRIPTION OF EMBODIMENTS

The illustration in the drawing is schematically. In different drawings, similar or identical elements are provided with the similar or same reference signs.

For the following illustration of the planar extended drain transistor and method of producing the same it is referred to FIGS. 1 to 6. All exemplary embodiments are described for an NMOS device, however PMOS devices are of course also possible.

Figure 1A:
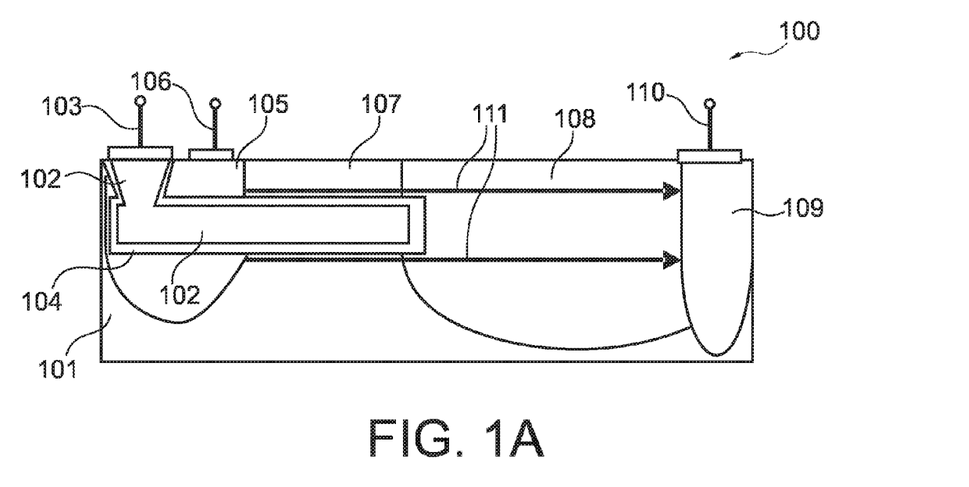
FIG. 1 schematically illustrates a planar extended drain transistor according to a first exemplary embodiment.
Figure 1B:
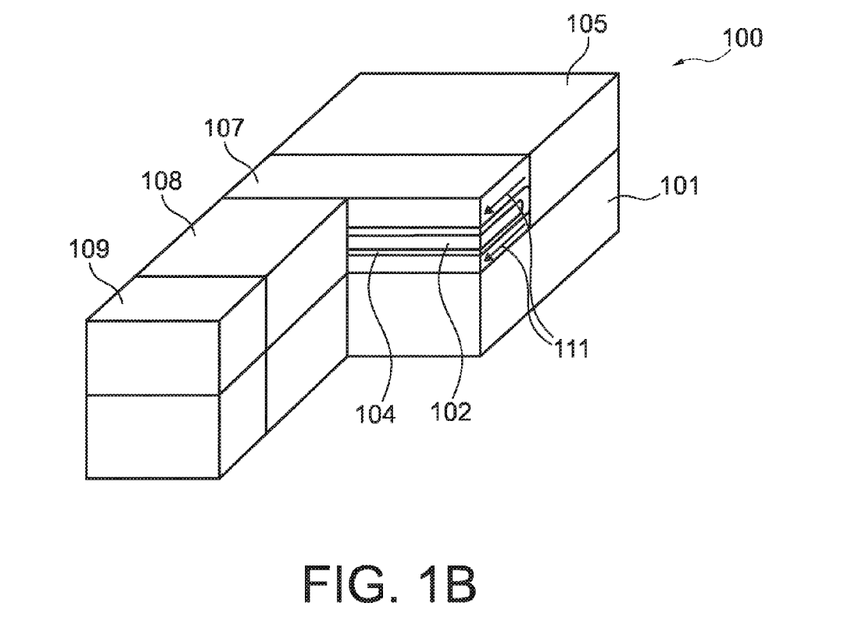

FIG. 1 schematically shows a planar extended drain transistor (planar EDMOS Transistor) 100 according to a first exemplary embodiment. The EDMOS transistor 100 of FIG. 1A comprises a substrate 101 onto or from which different regions are formed. From the left to the right in FIG. 1A a control gate 102 connected to a control gate contact 103 and surrounded by a gate insulation layer 104. The control gate is partially formed in and underneath a source region 105 which is formed by a highly doped region (N++) and connected to a source region contact 106. A channel region 107 is formed by a p-well through which portions of the control gate 102 extend so that the channel region 107 buries these portions. Next a drift region 108 is formed in the substrate, which drift region is only lightly doped (N−). Next, a drain region 109 is formed by a highly doped region (N++), wherein the drain region 109 is connected to a drain contact 110. The arrows 111 schematically illustrate the current flows. In particular, it may be noted that two channel regions or current paths are formed, which are arranged in FIG. 1A below and above the portion of the control gate 102 which is buried in the channel region or channel layer. FIG. 1B shows a perspective view of the EDMOS transistor of FIG. 1A. For illustrative reasons a portions of the drain region 109 and the drift region 108 are cut away and the different regions are shown as simple cuboids. Furthermore, the control gate contact and the contacts are omitted in FIG. 1B for the sake of clarity.

Figure 2:
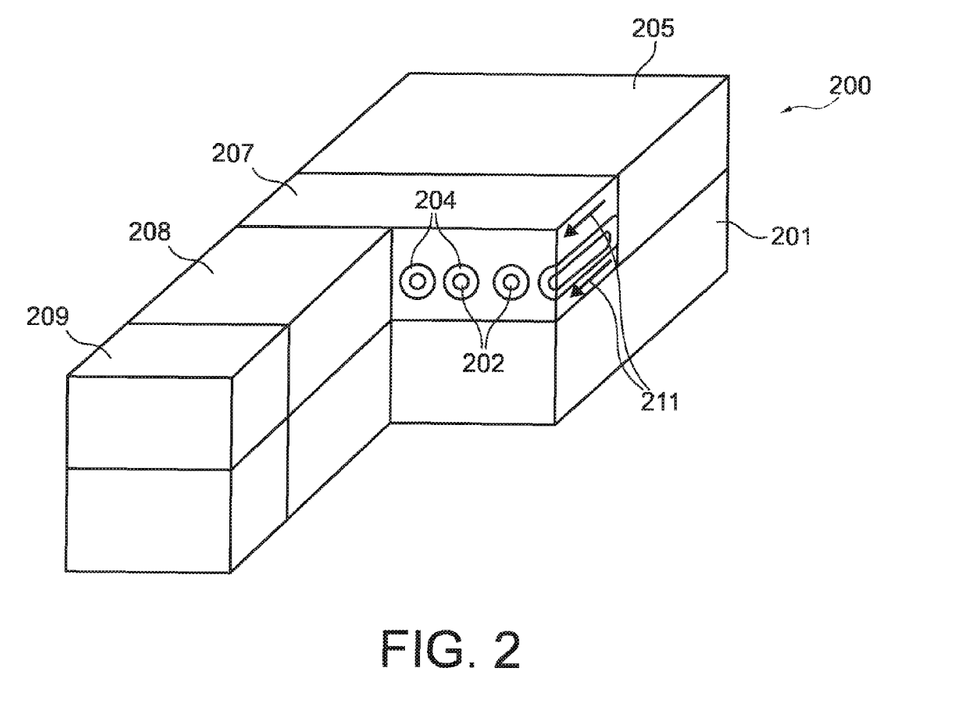
FIG. 2 schematically illustrates a planar extended drain transistor according to a second exemplary embodiment.

FIG. 2 schematically shows a planar extended drain transistor 200 according to a second exemplary embodiment. The EDMOS transistor 200 of FIG. 2 is shown in a perspective view corresponding to FIG. 1B. The EDMOS transistor 200 comprises a substrate 201 onto or from which different regions are formed. From the top right to the bottom left in FIG. 2 the planar extended drain transistor comprises a plurality of control gates 202, which are not shown in the upper part of the FIG. 2 and which may be contacted to a control gate contact, which is also not shown for clarity reasons. Each of the plurality of control gates is formed by a tube-like structure. Gate insulation layers 204 surround the control gates. As shown in FIG. 2A the control gates are partially formed in and underneath a source region 205 which is formed by a highly doped region (N++) and which may be connected to a source region contact. Next a channel region 207 is formed by a p-well through which portions of the control gate 202 extend so that these portions are buried by the channel region 207. Next a drift region 208 is formed in the substrate, which drift region is only lightly doped (N−). Next a drain region 209 is formed by a highly doped region (N++), wherein the drain region 209 may be connected to a drain contact. The arrows 211 schematically illustrate the current flows. In particular, it may be noted that a plurality of channel regions or current paths are formed, which are arranged in FIG. 2 below and above the portion of the control gate 102 which is buried in the channel region or channel layer.

Figure 3A:
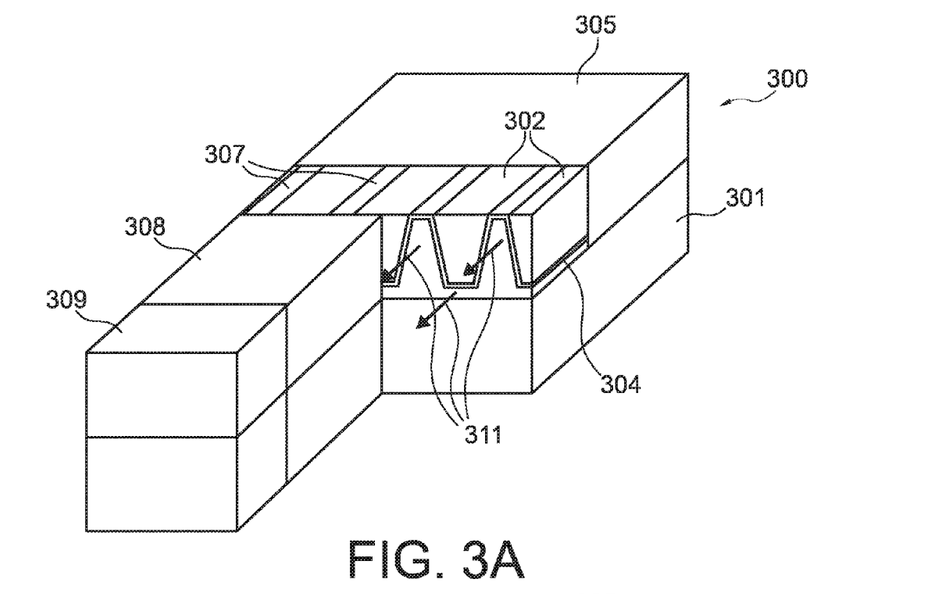
FIG. 3 schematically illustrates a planar extended drain transistor according to a third exemplary embodiment.

FIG. 3 schematically shows a planar extended drain transistor 300 according to a third exemplary embodiment. The EDMOS transistor 300 of FIG. 3A is shown in a perspective view corresponding to FIG. 2. The EDMOS transistor 300 comprises a substrate 301 onto or from which different regions are formed. From the top right to the bottom left in FIG. 3A the planar extended drain transistor comprises a source region 305 which is formed by a highly doped region (N++) and which may be connected to a source region contact. Next a channel region 307 is formed by a p-well. Into the channel region 307 or channel layer a plurality of control gates 302 are embedded which may be contacted to a control gate contact, which is not shown for clarity reasons. Each of the plurality of control gates is formed by a comb-like structure. The control gates are surrounded by gate insulation layers 304 and are buried at least partially into the channel layer 307. That is, the control gates are build in trenches formed in the channel layer 307 so that side areas of the comb-like structure are in close contact with the channel layer 307 so that a plurality of channel regions or current paths are formed.

Next a drift region 308 is formed in the substrate, which drift region is only lightly doped (N−). Next a drain region 309 is formed by a highly doped region (N++), wherein the drain region 309 may be connected to a drain contact. The arrows 311 schematically illustrate the current flows.

Figure 3B:
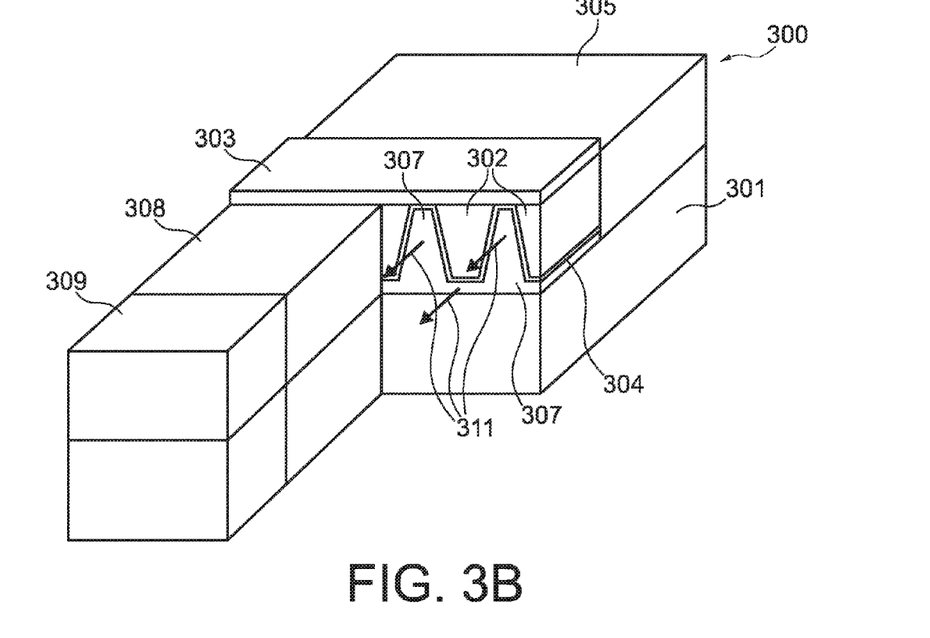
Figure 4A:
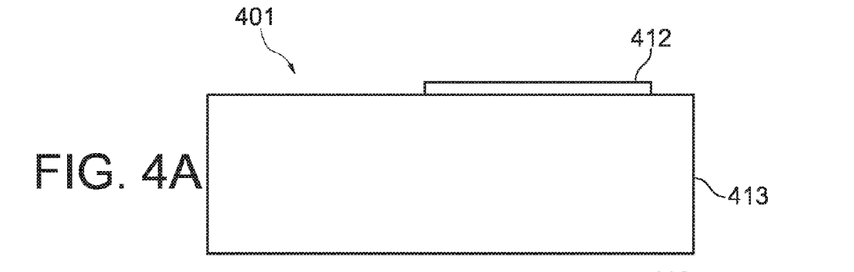
FIG. 4 schematically illustrates a process flow of a method of producing the planar extended drain transistor according to the first exemplary embodiment.
Figure 4B:
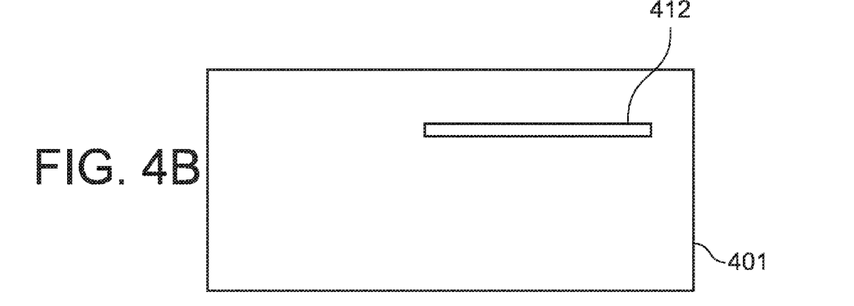
Figure 4C:
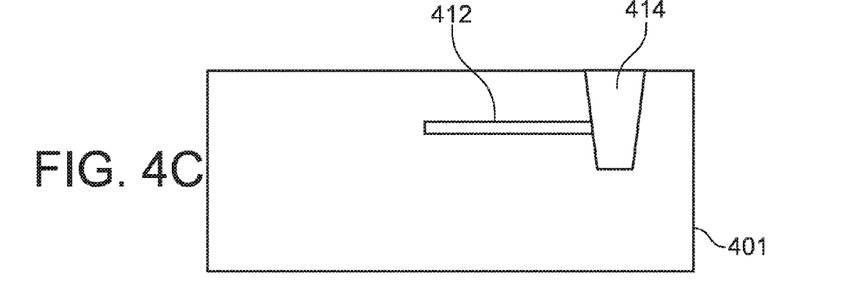
Figure 4D:
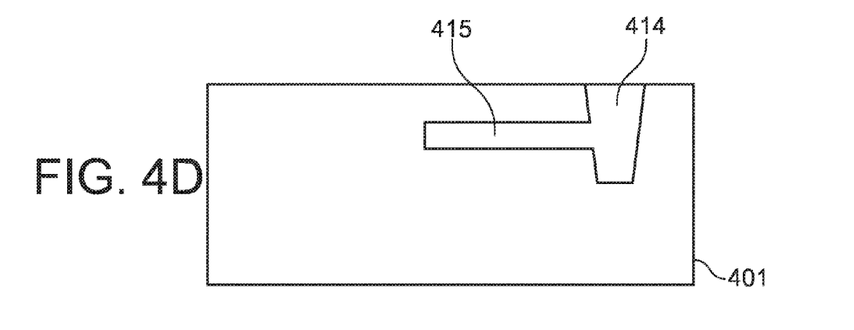
Figure 4E:
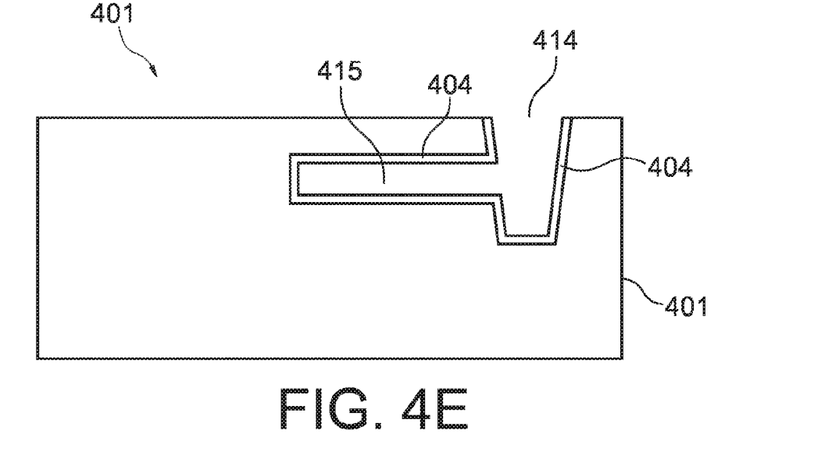
Figure 4F:
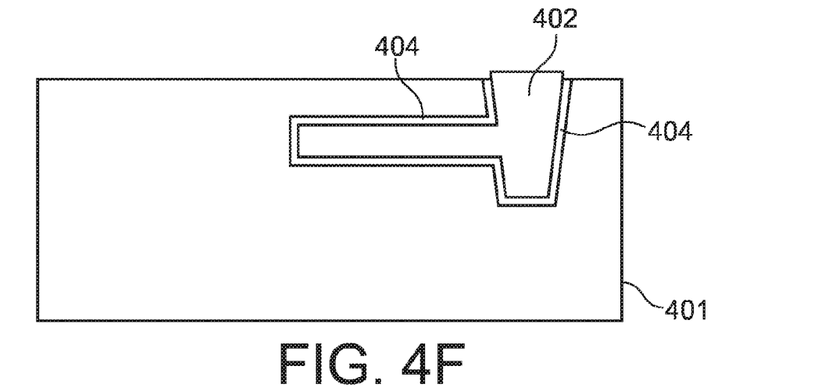
Figure 4G:
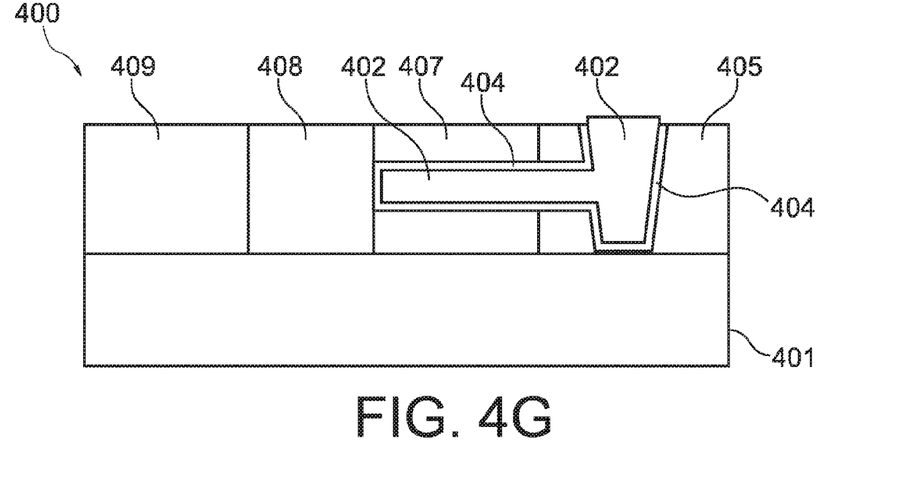

FIG. 3B shows the planar extended drain transistor 300 of FIG. 3A, wherein a control gate contact 303 is applied onto the plurality of comb-like control gates 302.

FIG. 4 schematically illustrate a process flow of a method of producing the planar extended drain transistor according to the first exemplary embodiment which may be similar to conventional EDMOS process flow, however it may be different in that the process flow according to an exemplary embodiment may be suitable to bury a gate into silicon, e.g. channel region, and to connect it afterwards. In a first process step, the result of which is shown in FIG. 4A, a silicon-germanium (SiGe) layer 412 may be formed in a first portion of a first sub layer 413 of a silicon substrate 401. In a next step, the result of which is shown in FIG. 4B, the SiGe layer 412 is buried by a second sub layer of the silicon substrate 401 which may be grown on the first sub layer by epitaxy, wherein the second sub layer has a predetermined thickness. Optionally, a plurality of intermediate layers and sub layers of a semiconductor material, e.g. silicon, may be formed, which may lead to a transistor having a plurality of control gates arranged in a sandwich structure. In a next step, the result of which is shown in FIG. 4C, a trench 414 is dig into the second sub layer, the SiGe layer 412, and optionally into the first sub layer 413 so that the buried SiGe layer 412 is reached. The digging may be performed by using a so-called STI (Shallow Trench Isolation) mask in an etching process. Afterwards, the SiGe layer 412 is removed by etching, the result of which is shown in FIG. 4D. Because the etching rate of SiGe is higher than that one of the silicon of the substrate 401, the SiGe layer 412 can be selectively removed without attacking the silicon of the substrate 401. Thus, a cavity 415 in the silicon substrate 401 may be formed. In a next step, the result of which is shown in FIG. 4E, a gate oxide 404, i.e. a gate insulation layer formed by silicon oxide, for example, is grown or deposited in the trench 414 and the cavity 415. Afterwards in a further step, the result of which is shown in FIG. 4F, the control gate 402 may be formed by depositing a electrically conductive material like polysilicon. In further steps, the result of which is shown in FIG. 4G, the different parts of the planar extended drain transistor 400 may be formed by implantation of the necessary doping material. Thus, a drain region 409, a drift region 408, a channel region 407, and a source region 405 is formed.

Figure 5A:
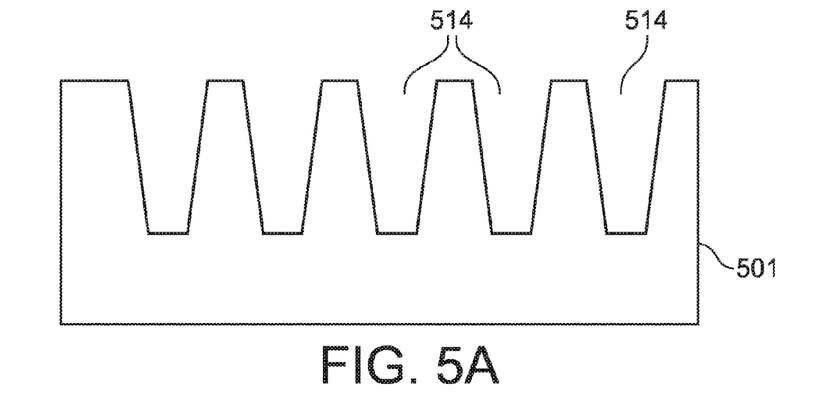
FIG. 5 schematically illustrates a process flow of a method of producing the planar extended drain transistor according to the second exemplary embodiment.
Figure 5B:
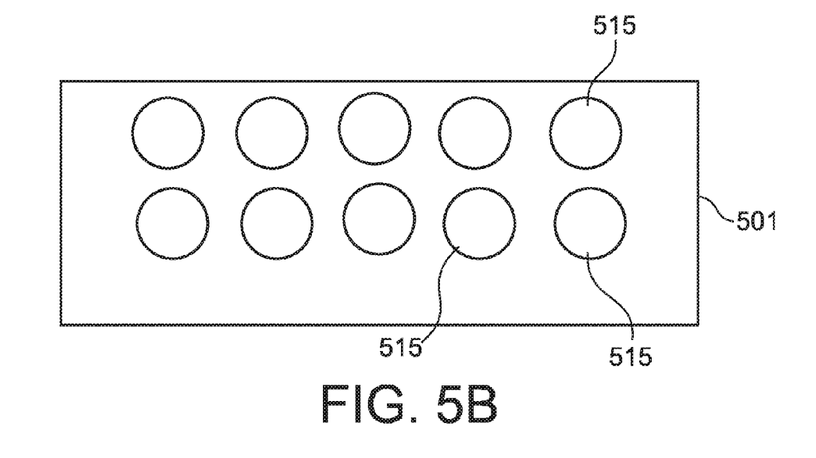
Figure 5C:
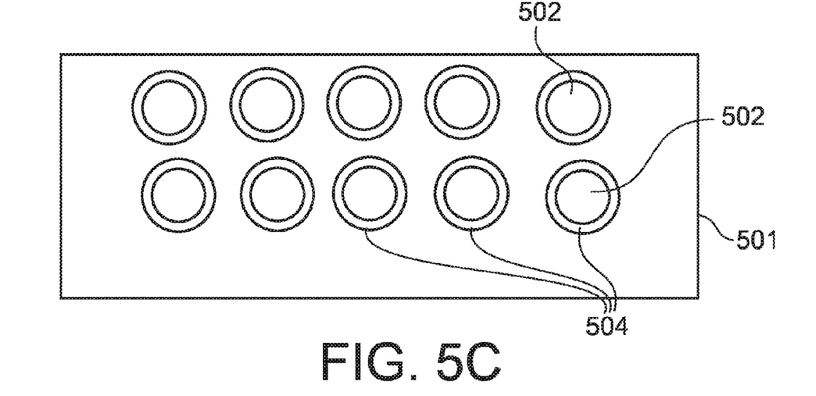

FIG. 5 schematically illustrate a process flow of some steps of a method of producing the planar extended drain transistor according to the second exemplary embodiment which may be similar to the above described process flow, but which process relies on hydrogen annealing to create a plurality of cavities. Therefore, only the differences are described in greater detail. In particular, no SiGe layer is deposited. In a first shown step, the result of which is shown in FIG. 5A, a plurality of trenches 514 are dig into a silicon substrate 501, e.g. by an etching process in which an STI mask is used. In a next step, the result of which is shown in FIG. 5B, the silicon of the silicon substrate 501 is exposed to a hydrogen atmosphere at high temperature. Under such conditions silicon atoms start to migrate and create tube-like cavities 515 in the silicon substrate 501 out of the trenches 514. Similar as described above each of the cavities 515 may be filled by a gate insulation layer 504 and a control gate 502 formed by silicon oxide and polysilicon, respectively, which is shown in FIG. 5C. In further steps the different parts of the planar extended drain transistor may be formed by implantation of the necessary doping material.

Figure 6A:
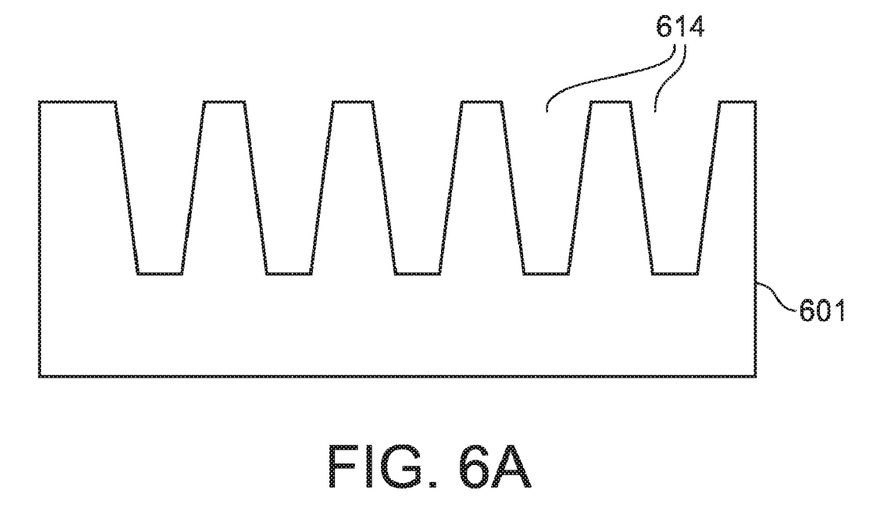
FIG. 6 schematically illustrates a process flow of a method of producing the planar extended drain transistor according to the third exemplary embodiment.
Figure 6B:
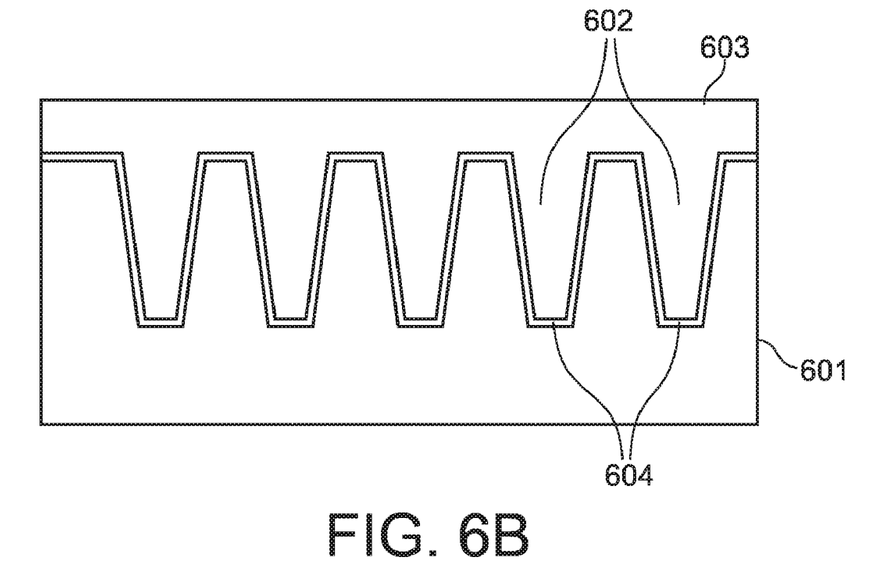

FIG. 6 schematically illustrates some steps of a process flow of a method of producing the planar extended drain transistor according to the third exemplary embodiment. The process flow of the third exemplary embodiment may be similar to the above described process flow of the second exemplary embodiment. Therefore, only the differences are described greater detail. As in the second exemplary embodiment a plurality of trenches 614 are dig into a silicon substrate 601, e.g. by an etching process which applies an STI mask. However, according to the third exemplary embodiment no cavities are formed, but a gate insulation layer 604 is deposited in each trench 614. Afterwards the control gates 602 are formed, e.g. by depositing polysilicon onto the gate insulation layers 604. On top of the control gates 602 a control gate contact 603 is formed which electrically connects all control gates 602.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A planar extended drain transistor comprising:
   a control gate;
   a drain region;
   a channel region; and
   a drift region,
   wherein the drift region is arranged between the channel region and the drain region;
   wherein the control gate is at least partially buried into the channel region;
   wherein a portion of the channel region is disposed on top of at least a portion of the control gate; and
   wherein the drift region comprises a doping material density which is lower than the doping material density of the drain region.

2. The planar extended drain transistor according to claim 1, further comprising:
   a control gate contact; and
   a source region,
   wherein the control gate contact is electrically connected to the control gate; and
   wherein the source region is at least partially arranged between the channel region and the control gate contact.

3. The planar extended drain transistor according claim 2, wherein the control gate is formed by a layer, in particular, by a planar layer.

4. The planar extended drain transistor according claim 2, further comprising:
   a plurality of control gates,
   wherein the control gates have a substantially circular cross section.

5. The planar extended drain transistor according to claim 2, wherein the control gate longitudinally extends along an axis between the source region and the drift region, wherein the control gate is completely embedded within the channel region along the axis between the source region and the drift region.

6. The planar extended drain transistor according claim 1, further comprising:
   a plurality of control gates,
   wherein the plurality of control gates are arranged in a comb structure.

7. The planar extended drain transistor according claim 6, further comprising:
   at least one control gate contact; and
   a source region,
   wherein the at least one control gate contact is electrically connected to at least one of the plurality of control gates; and
   wherein the at least one control gate contact is at least partially arranged between the drift region and the source region.

8. The planar extended drain transistor according to claim 1, wherein a plurality of current flow paths are provided along a longitudinal axis between the source region and the drain region.

9. The planar extended drain transistor according to claim 8, wherein a first of the plurality of current flow paths is in a first portion of the channel region above the control gate, and wherein a second of the plurality of current flow paths is in a second portion of the channel region below the control gate.

10. A method of manufacturing a planar extended drain transistor, the method comprising:
    forming a semiconductor layer on a substrate, wherein the semiconductor layer has a first side which is in contact with the substrate and a second opposite side which forms a surface;
    forming a trench into a first portion of the semiconductor layer by removing parts of the semiconductor layer in the first portion in such a way that at least a portion of the trench below the surface of the semiconductor layer is removed;
    forming a control gate in the trench;
    forming a planar extended drain transistor by forming a drain region, a source region, a drift region, and a channel region in the semiconductor layer, wherein the channel region is formed in the first portion in such a way that at least a portion of the control gate is buried in the channel region;
    forming an intermediate layer onto a second portion of the substrate; and
    forming the semiconductor layer onto the substrate and the intermediate layer in such a way that the first portion of the semiconductor layer is arranged on the intermediate layer.

11. The method according to claim 10, further comprising:
    forming of the trench is done in such a way that the intermediate layer is contacted by the trench.

12. The method according to claim 11, further comprising:
forming a cavity by removing the intermediate layer before the control gate is formed.

13. The method according to claim 10, further comprising:
forming a control gate contact which connects the control gate formed in the trench,
wherein the source region is formed at least partially between the channel region and the control gate contact.

14. A method of manufacturing a planar extended drain transistor, the method comprising:
forming a semiconductor layer on a substrate, wherein the semiconductor layer has a first side which is in contact with the substrate and a second opposite side which forms a surface;
forming a plurality of trenches into a first portion of the semiconductor layer by removing parts of the semiconductor layer in the first portion in such a way that at least a portion of the plurality of trenches below the surface of the semiconductor layer is removed;
forming a planar extended drain transistor by forming a drain region, a source region, a drift region, and a channel region in the semiconductor layer;
forming a plurality of tubular-shaped cavities from the plurality of trenches; and
forming a plurality of control gates in the plurality of tubular-shaped cavities;
wherein the channel region is formed in the first portion in such a way that at least a portion of the plurality of control gates is buried in the channel region.

15. The method according to claim 14, further comprising:
forming one control gate contact contacting at least a number of the plurality of control gates in the first portion of the semiconductor.

16. The method according to claim 14, further comprising:
forming a further trench into the semiconductor layer in such a way that at least a portion of each of the cavities is exposed to the further trench.

17. A planar extended drain transistor comprising:
a plurality of control gates;
a drain region;
a channel region;
a drift region;
a control gate contact; and
a source region;
wherein the drift region is arranged between the channel region and the drain region;
wherein the plurality of control gates are at least partially buried into the channel region;
wherein the drift region comprises a doping material density which is lower than the doping material density of the drain region.
wherein the control gate contact is electrically connected to the plurality of control gates; and
wherein the source region is at least partially arranged between the channel region and the control gate contact; and
wherein the plurality of control gates have a substantially circular cross section.

* * * * *